United States Patent
Nishimaki et al.

(10) Patent No.: US 10,523,147 B2
(45) Date of Patent: Dec. 31, 2019

(54) MOTOR DRIVING DEVICE, AIR CONDITIONING DEVICE INCLUDING SAME, AND CONTROL METHOD FOR MOTOR DRIVING DEVICE

(71) Applicant: Samsung Electronics Co., Ltd., Suwon-si, Gyeonggi-do (KR)

(72) Inventors: Yoshiya Nishimaki, Yokohama (JP); Yuichi Takeda, Yokohama (JP)

(73) Assignee: Samsung Electronics Co., Ltd., Suwon-si (KR)

(*) Notice: Subject to any disclaimer, the term of this patent is extended or adjusted under 35 U.S.C. 154(b) by 0 days.

(21) Appl. No.: 16/064,952

(22) PCT Filed: Dec. 15, 2016

(86) PCT No.: PCT/KR2016/014729
§ 371 (c)(1),
(2) Date: Jun. 21, 2018

(87) PCT Pub. No.: WO2017/111390
PCT Pub. Date: Jun. 29, 2017

(65) Prior Publication Data
US 2019/0020294 A1    Jan. 17, 2019

(30) Foreign Application Priority Data
Dec. 24, 2015 (JP) ................. 2015-250819

(51) Int. Cl.
*H02P 21/16* (2016.01)
*H02P 21/22* (2016.01)
(Continued)

(52) U.S. Cl.
CPC .......... *H02P 21/16* (2016.02); *G01R 27/2611* (2013.01); *H02P 21/18* (2016.02);
(Continued)

(58) Field of Classification Search
CPC ....................................................... H02P 21/16
(Continued)

(56) References Cited

U.S. PATENT DOCUMENTS 5,506,486 A * 4/1996 Hayashi .............. F04C 18/0215
318/808
6,788,024 B2 * 9/2004 Kaneko ................... H02P 21/16
318/700

(Continued)

FOREIGN PATENT DOCUMENTS

JP    2000050700 A    2/2000
JP    2002272195 A    9/2002
(Continued)

OTHER PUBLICATIONS

ISA/KR, "International Search Report and International Search Report," International Application No. PCT/KR2016/014729, dated Apr. 11, 2017, 10 pages.

*Primary Examiner* — David Luo (57) ABSTRACT

An aspect of the disclosed invention calculates a value of an inductance of a synchronous motor whose characteristic is unclear while suppressing a failure of the synchronous motor. A motor driving device according to an embodiment of the disclosed invention comprises: a motor; an inverter for supplying an alternating voltage to the motor; a current meter for measuring an introduced current flowing through the motor on the basis of the alternating voltage; and a control unit for controlling the inverter to change the size of the alternating voltage in stages, and calculating an inductance of the motor on the basis of the introduced current measured by the current meter.

16 Claims, 9 Drawing Sheets

(51) Int. Cl.
*H02P 21/18* (2016.01)
*G01R 27/26* (2006.01)
*H02P 27/05* (2006.01)
*F24F 11/30* (2018.01)
*G01R 31/34* (2006.01)

(52) U.S. Cl.
CPC .............. *H02P 21/22* (2016.02); *H02P 27/05* (2013.01); *F24F 11/30* (2018.01); *G01R 31/34* (2013.01)

(58) Field of Classification Search
USPC ................................ 318/805, 798, 767, 727
See application file for complete search history.

(56) References Cited

U.S. PATENT DOCUMENTS

| | | | |
|---|---|---|---|
| 9,154,065 B2* | 10/2015 | Yamazaki | ............... H02P 6/183 |
| 9,184,687 B2* | 11/2015 | Handa | ................... H02P 27/085 |
| 2010/0060210 A1 | 3/2010 | Liu et al. | |
| 2012/0123715 A1 | 5/2012 | Eskola et al. | |

FOREIGN PATENT DOCUMENTS

| KR | 10-2013-0039613 A | 4/2013 |
|---|---|---|
| KR | 10-2013-0095819 A | 8/2013 |
| KR | 10-1353583 B1 | 1/2014 |

* cited by examiner

MOTOR DRIVING DEVICE, AIR CONDITIONING DEVICE INCLUDING SAME, AND CONTROL METHOD FOR MOTOR DRIVING DEVICE

CROSS-REFERENCE TO RELATED APPLICATIONS AND CLAIM OF PRIORITY

This application is a 371 National Stage of International Application No. PCT/KR2016/014729, filed Dec. 15, 2016, which claims priority to Japanese Patent Application No. JP 2015-250819, filed Dec. 24, 2015, the disclosures of which are herein incorporated by reference in their entirety.

BACKGROUND

1. Field

The present disclosure relates to a motor driving device, an air conditioning device including the same and a method of controlling a motor driving device.

2. Description of Related Art

A rotation operation of a synchronous motor is controlled using a method called vector control. The vector control of the synchronous motor uses various motor constants including an inductance of the synchronous motor.

In the patent document 1 (Japanese Patent Laid-Open No. 2002-272195), an alternating current (AC) voltage in a direction parallel to a direct current (DC) shaft which rotates at an arbitrary frequency is applied to a synchronous motor, an AC current generated in the DC shaft is detected, and when the DC shaft is rotated at 180 degrees or more, a direct axis inductance (Ld) is calculated from maximum values of the AC voltage and the AC current of the DC shaft, and a quadrature axis inductance (Lq) is calculated from minimum values thereof.

In addition, in the patent document 2 (Japanese Patent Laid-Open No. 2000-507000, a method of calculating motor constants of a permanent magnet type synchronous motor includes a voltage applying operation of changing an AC frequency component of an application voltage in which a DC component and the AC component are mixed and applying the changed application voltage to the permanent magnet type synchronous motor, a current detecting operation of detecting a motor current flowing according to the applied application voltage, a phase difference calculation operation of calculating a phase difference between the AC component of the application voltage and an AC component of the motor current, and a motor constant calculation operation of calculating motor constants of the permanent magnet type synchronous motor.

SUMMARY

However, in the methods of calculating the inductance described in the above patent documents, it is a prerequisite that other motor constants including a rated current of the synchronous motor and the like except for the inductance are already known. Accordingly, when an inductance of a synchronous motor having unknown motor constants has to be calculated, a voltage and the like supplied to the synchronous motor are unclear, and thus there is a risk in that an error of the calculated inductance can become large. In addition, in a case in which a current exceeding the rated current of the synchronous motor, there is a risk of demagnetization in the synchronous motor.

In accordance with an aspect of the present disclosure, a motor driving device includes: a motor; an inverter configured to supply an alternating current (AC) voltage to the motor; a current meter configured to measure an introduced current flowing in the motor on the basis of the AC voltage; and a controller configured to control the inverter to gradually change a magnitude of the AC voltage and calculate an inductance of the motor on the basis of the introduced current measured by the current meter.

The controller may calculate a d-axis inductance or q-axis inductance of the motor on the basis of the introduced current measured by the current meter.

When a change in the d-axis inductance calculated on the basis of the changed AC voltage is saturated, the controller may determine a value of the saturated inductance as a d-axis inductance.

The controller may calculate the d-axis inductance and rotate a rotor of the motor at a predetermined angle.

The controller may calculate the d-axis inductance and calculate the q-axis inductance on the basis of an AC voltage changed when the d-axis inductance is calculated.

The controller may control the inverter to supply the changed AC voltage to the motor, and calculate the q-axis inductance on the basis of the introduced current measured by the current meter.

The motor may include a rotor including a permanent magnet and a stator, and the controller may control the rotor to determine a position of the motor and control the inverter to gradually change the AC voltage.

In accordance with another aspect of the present disclosure, a method of controlling a motor driving device including a motor and an inverter configured to control the motor includes: gradually changing a magnitude of an alternating current (AC) voltage; supplying, by the inverter, the AC voltage to the motor; measuring an introduced current flowing in the motor on the basis of the changed AC voltage; and calculating an inductance of the motor on the basis of the measured introduced current.

The calculating may include calculating a d-axis inductance or q-axis inductance of the motor on the basis of the measured introduced current.

When a change in the d-axis inductance calculated on the basis of the changed AC voltage is saturated, the calculating may include determining a value of the saturated inductance as a d-axis inductance.

The calculating may include calculating the q-axis inductance on the basis of the changed AC voltage when the d-axis inductance is calculated.

The method may further include performing vector control on the motor on the basis of the calculated d-axis inductance or the calculated q-axis inductance.

The method may further include supplying, by the inverter, a position determination current to the motor and fixing a position of the motor.

The calculating may include: storing a d-axis inductance calculated on the basis of the AC voltage as a first result value; storing a d-axis inductance calculated according to the gradually changed AC voltage as a second result value; and comparing the first result value and the second result value and determining the d-axis inductance.

In accordance with still another aspect of the present disclosure, an air conditioning device includes: a heat exchanger configured to exchange heat of air using a refrigerant; a fan configured to be rotatable and introduce the air into the heat exchanger; and a motor driving device configured to drive the fan, wherein the motor driving device includes a motor configured to rotate the fan, an inverter configured to supply an alternating current (AC) voltage to the motor, a current meter configured to measure an introduced current flowing in the motor on the basis of the AC voltage, and a controller configured to perform vector control on the inverter, control the inverter to gradually change a magnitude of the AC voltage, and calculate an inductance of the motor on the basis of the introduced current.

According to one aspect of the present disclosure, in a motor driving device, an air conditioning device including the same, and a method of controlling the motor driving device, since a voltage to be supplied to a synchronous motor is controlled, an incorrect estimated inductance value is not acquired, and a motor constant can be acquired by calculating an inductance and used for vector control of the synchronous motor.

In addition, since the correct vector control is performed, supply to the synchronous motor with excessive current greater than a rating of the synchronous motor can be prevented, and occurrence of demagnetization in the synchronous motor can be suppressed.

In addition, since a correct inductance is calculated, the motor driving device need not be provided on the basis of a type or a property of the synchronous motor included in an indoor unit of the air conditioning device, and thus the motor driving device and the air conditioning device having versatility can be provided.

DETAILED DESCRIPTION

Like reference numerals denote like elements throughout the specification. In the specification, all elements of embodiments are not described, and general contents in the art or repeated contents between the embodiments will not be described. Terms such as parts, modules, members, and blocks may be realized using software or hardware, and a plurality of parts, modules, members, and blocks are realized in a single element, or one part, module, member, or block may also include a plurality of elements.

Throughout the specification, when a part is referred to as being "connected" to another part, it includes "directly connected" and "indirectly connected," and the "indirectly connected" includes "connected through a wireless communication network."

In addition, when a part "includes" an element, another element may be further included, rather than excluding the existence of another element, unless otherwise described.

Throughout the specification, when a member is referred to as being "on" another member, the member is in contact with another member or yet another member is interposed between the two members.

Terms first, second, and the like are used herein to distinguish one element from another element, and the elements are not limited to the above-described terms.

As used herein, singular forms "a" and "an" are intended to include the plural forms as well, unless the context clearly indicates otherwise.

Reference numerals in operations are used for the sake of convenience in description and do not describe an order of the operations, and the operations may be performed through an order different from the described order unless the context clearly indicates a specific order.

Hereinafter, a principle of action and embodiments of the present disclosure will be described with reference to the accompanying drawings.

Full Configuration of Air Conditioning Device

Figure 1:
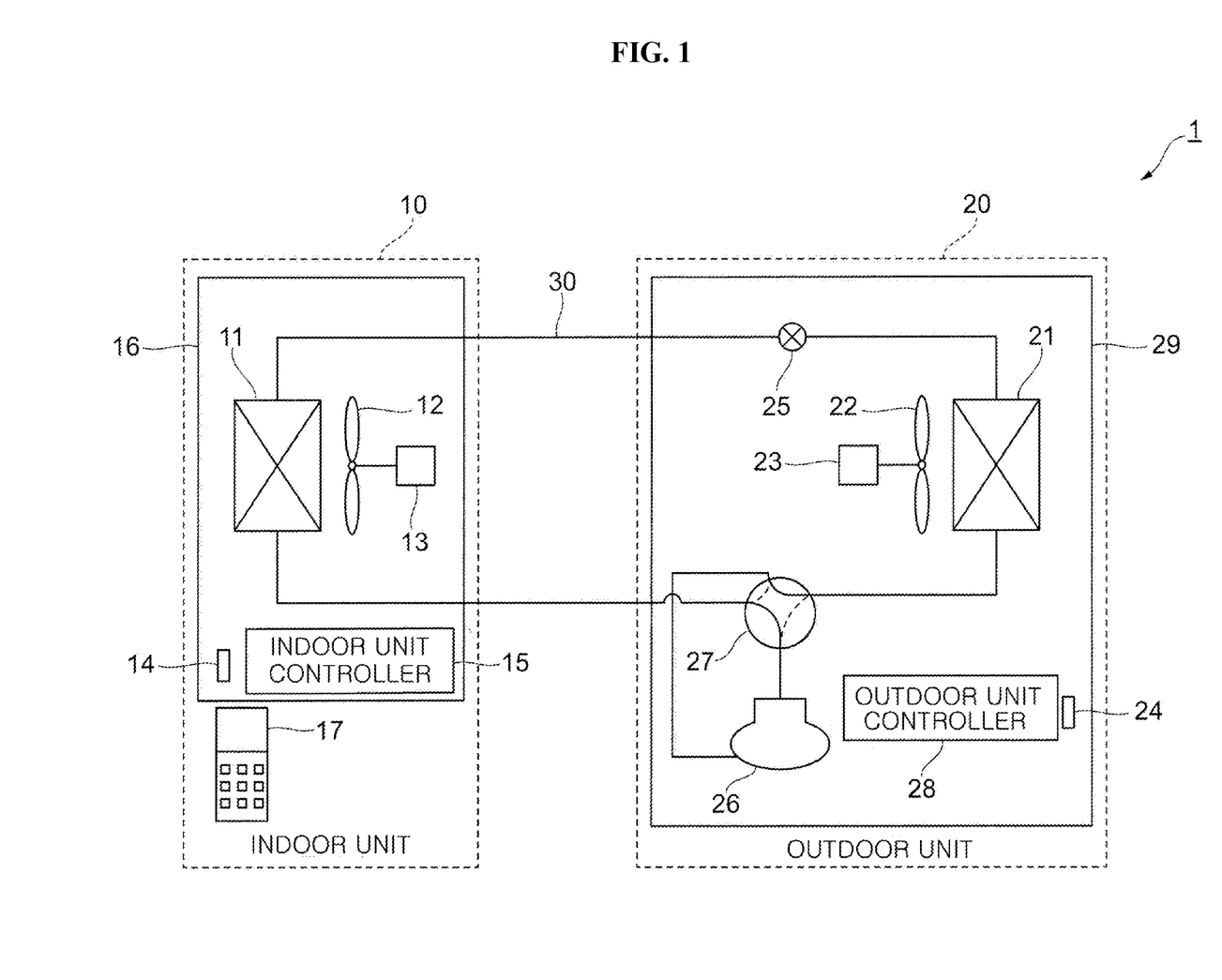
FIG. 1 is a view illustrating a full configuration of an air conditioning device according to one embodiment.

FIG. 1 is a view illustrating a full configuration of an air conditioning device according to one embodiment.

A disclosed air conditioning device 1 includes an indoor unit 10 installed in a house (indoors), an outdoor unit 20 installed outdoors, and a pipe 30 connecting the indoor unit 10 and the outdoor unit 20. In addition, the air conditioning device 1 circulates a refrigerant (not shown) using the pipe 30 between the indoor unit 10 and the outdoor unit 20 and exchanges heat of the refrigerant in the indoor unit 10 and the outdoor unit 20 so that an interior in which the indoor unit 10 is disposed is cooled or heated.

Among the above-described units, the indoor unit 10 includes an indoor heat exchanger 11, an indoor fan 12, an indoor motor driving device 13 configured to drive the indoor fan, an indoor temperature sensor 14, an indoor unit controller (or a controller) 15, an indoor housing 16, and a remote controller 17.

As one example of a heat exchanger, the indoor heat exchanger 11 is configured such that the refrigerant (not shown) supplied from the outdoor unit 20 through the pipe 30 passes through an inside of the indoor heat exchanger 11 and heat is exchanged between indoor air and the refrigerant.

As one example of a blower, the indoor fan 12 is rotatably installed and introduces and supplies indoor air into the indoor heat exchanger 11 so that cooled or heated air flows to the interior.

The indoor motor driving device 13 rotates the indoor fan 12. The indoor motor driving device 13 adjusts revolutions per unit time of the indoor fan 12 when rotating the indoor fan 12.

The indoor temperature sensor 14 measures an indoor temperature.

As one example of the disclosed motor driving device, the indoor unit controller 15 controls operations of components and devices constituting the indoor unit 10. In addition, the indoor unit controller 15 controls operations of components and devices constituting the outdoor unit 20 using an outdoor unit controller 28 installed in the outdoor unit 20.

The indoor housing 16 accommodates the above-described indoor heat exchanger 11, the indoor fan 12, the indoor motor driving device 13, the indoor temperature sensor 14, and the indoor unit controller 15 therein.

The remote controller 17 may transmit a command to the indoor unit controller 15 from the outside of the indoor housing 16 using infrared rays, radio waves, or the like. That is, the remote controller 17 outputs instructions for turning power on/off, setting temperature, and setting a timer of the disclosed air conditioning device 1 through the indoor unit controller 15.

Meanwhile, the outdoor unit 20 may include an outdoor heat exchanger 21, an outdoor fan 22, an outdoor fan driving device 23, an outdoor temperature sensor 24, an expansion valve 25, a compressor 26, a four-way switching valve 27, an outdoor unit controller 28, and an outdoor housing 29.

The outdoor heat exchanger 21 is configured such that a refrigerant (not shown) supplied from the indoor unit 10 through the pipe 30 passes through the outdoor heat exchanger 21, and exchanges heat between outdoor air and the refrigerant.

The outdoor fan 22 is rotatably installed and introduces the outdoor air into the outdoor heat exchanger 21.

The outdoor fan driving device 23 rotates the outdoor fan 22. The outdoor fan driving device 23 adjusts revolutions per unit time when rotating the outdoor fan 22.

The outdoor temperature sensor 24 measures an outdoor temperature.

The expansion valve 25 may be formed as a two-way valve, reduce a pressure of the refrigerant introduced from the indoor heat exchanger 11 of the indoor unit 10 through the pipe 30, and discharge the refrigerant to the outdoor heat exchanger 21 during cooling. In addition, the expansion valve 25 increases a pressure of a refrigerant introduced from the outdoor heat exchanger 21 of the outdoor unit 20 and discharges the refrigerant to the indoor heat exchanger 11 of the indoor unit 10 through the pipe 30 during heating.

The compressor 26 compresses the refrigerant introduced from the outdoor heat exchanger 21 through the four-way switching valve 27 and discharges a high temperature and high pressure gas refrigerant. In addition, the compressor 26 also has a function configured to provide a transfer force to the refrigerant for circulating the refrigerant between the indoor unit 10 and the outdoor unit 20 through the pipe 30.

The four-way switching valve 27 is formed as a four-way valve, and changes a flow path of the refrigerant supplied to the compressor 26 from the indoor heat exchanger 11 or the outdoor heat exchanger 21 during cooling or heating.

The outdoor unit controller 28 controls the operations of the components and devices constituting the outdoor unit 20 using the indoor unit controller 15 installed in the indoor unit 10.

The outdoor housing 29 accommodates the above-described outdoor heat exchanger 21, the outdoor fan 22, the outdoor fan driving device 23, the outdoor temperature sensor 24, the expansion valve 25, the compressor 26, the four-way switching valve 27, and the outdoor unit controller 28 therein.

Configuration of Indoor Motor Driving Device

Figure 2:
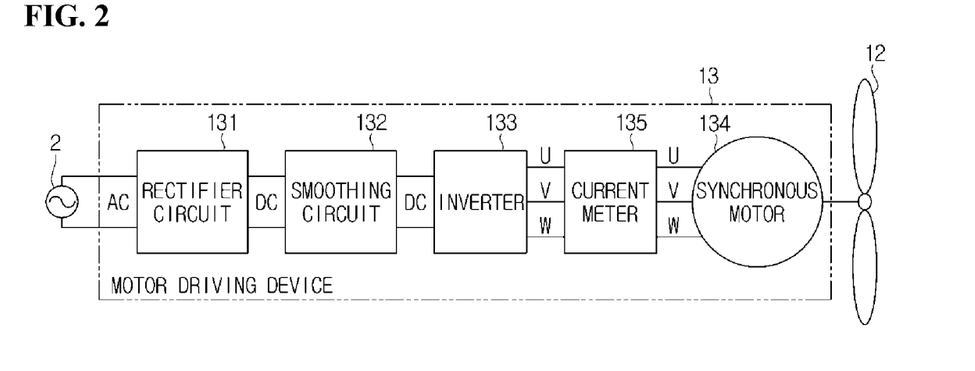
FIG. 2 is a view illustrating a configuration of a motor driving device in an indoor unit according to one embodiment.

FIG. 2 is a view illustrating a configuration of a motor driving device in an indoor unit according to one embodiment.

Referring to FIG. 2, the motor driving device 13 may include a rectifier circuit 131, a smoothing circuit 132, an inverter 133, a synchronous motor 134, and a current meter 135.

The rectifier circuit 131 may include a diode bridge and the like using four diodes. The rectifier circuit 131 converts a single-phase alternating current (AC) into a direct current (DC) by performing a full-wave rectification of the single-phase AC (an effective value of 100 V or 200 V) having a commercial power frequency (50 Hz or 60 Hz) supplied from a commercial power source 2. However, the rectifier circuit 131 outputs a pulsating current having ripples greater than those of a general DC.

The smoothing circuit 132 may include a condenser and the like, and smooth DC (pulsating current) supplied from the rectifier circuit 131.

The inverter 133 refers to a reverse transformation circuit and may include a semiconductor device and the like. The inverter 133 converts a DC supplied from the smoothing circuit 132 into a three-phase AC (U-phase, V-phase, and W-phase) set with a frequency and a voltage value. The inverter 133 may change the frequency and voltage value of the output three-phase AC while the synchronous motor 134 is operated.

The synchronous motor 134 rotates the indoor fan 12 using the three-phase AC supplied from the inverter 133.

In the disclosed one embodiment, the synchronous motor 134 may include a permanent magnet synchronous motor (PMSM) in which a permanent magnet (ferromagnetic substance) is included in a magnetic field system. However, the synchronous motor 134 is not limited thereto, and any motor configured to rotate the fan 12 is sufficient and the synchronous motor 134 has no limitations.

The current meter 135 measures a current value for each phase of the three-phase AC supplied to the synchronous motor 134 from the inverter 133.

In the indoor motor driving device 13, a single-phase AC having a frequency of a commercial power supplied from the commercial power source 2 is converted into a three-phase AC having a (variable) frequency using the rectifier circuit 131, the smoothing circuit 132, and the inverter 133, and the converted single-phase AC is supplied to the synchronous motor 134 configured to rotate the indoor fan 12.

Although not described in detail here, the outdoor fan driving device 23 in the outdoor unit 20 also has the same configuration as that of the motor driving device 13.

Configuration of Synchronous Motor

Figure 3:
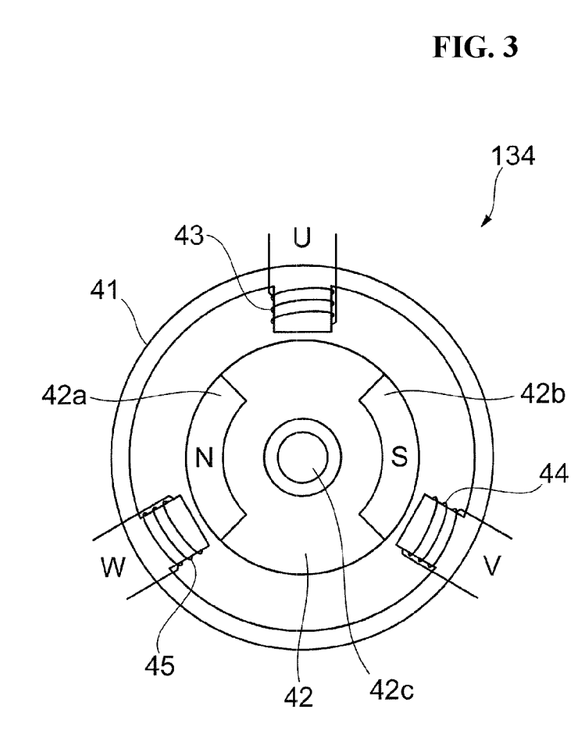
FIGS. 3 and 4 are schematic views illustrating a configuration of a synchronous motor used in an indoor motor driving device.
Figure 4:
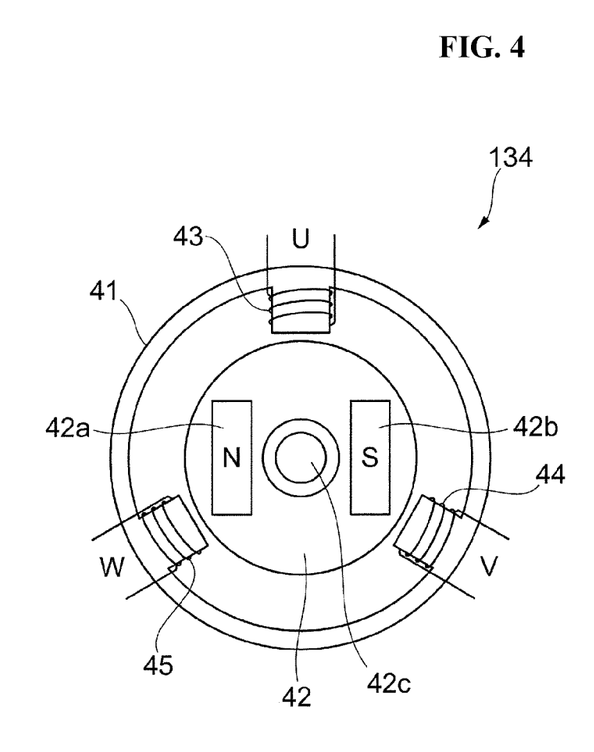

FIGS. 3 and 4 are schematic views illustrating a configuration of a synchronous motor used in an indoor motor driving device.

Specifically, FIG. 3 is a view illustrating a case in which the synchronous motor 134 is a surface permanent magnet synchronous motor (SPMSM), and FIG. 4 is a view illustrating a case in which the synchronous motor 134 is an interior permanent magnet synchronous motor (IPMSM).

In addition, the examples of the synchronous motor 134 having two poles are illustrated in FIGS. 3 and 4.

Referring to FIGS. 3 and 4, the synchronous motor 134 according to one embodiment may include a stator 41, a rotor 42, a U-phase coil 43, a V-phase coil 44, and a W-phase coil 45.

The stator 41 has a structure in which a space having a cylindrical shape is formed therein and is directly or indirectly fixed to the indoor housing 16 (see FIG. 1).

The rotor 42 has a cylindrical shape and is disposed in the space formed in the stator 41 and installed to be rotatable about a shaft 42c in the stator 41. In addition, the indoor fan 12 illustrated in FIG. 2 and the like is installed on the shaft 42c, and when the rotor 42 rotates, the indoor fan 12 is rotated by the shaft 42c.

The U-phase coil 43 is installed at a location facing the space formed in the stator 41. In addition, the U-phase coil 43 is connected to a U-phase of the three-phase AC supplied from the inverter 133 (see FIG. 2).

The V-phase coil 44 is installed at a location facing the space formed in the stator 41 and rotated 120 degrees from the U-phase coil 43 in a circumferential direction. In addition, the V-phase coil 44 is connected to a V-phase of the three-phase AC supplied from the inverter 133 (see FIG. 2).

The W-phase coil 45 is installed at a location facing the space formed in the stator 41 and rotated 120 degrees from the V-phase coil 44 in the circumferential direction (a location rotated −120 degrees from the U-phase coil 43 in the circumferential direction). In addition, the W-phase coil 45 is connected to a W-phase of the three-phase AC supplied from the inverter 133 (see FIG. 2).

In addition, a north (N) pole 42*a* which is one magnetic pole and a south (S) pole 42*b* which is the other magnetic pole provided at a side opposite (different from) the N pole 42*a* are formed in the rotor 42 of the synchronous motor 134. Here, in the synchronous motor 134 (SPMSM) illustrated in FIG. 3, the poles (the N pole 42*a* and the S pole 42*b*) are disposed at locations exposed from an outer circumferential surface of the rotor 42.

Comparatively, in the synchronous motor 134 (IPMSM) illustrated in FIG. 4, the poles (the N pole 42*a* and the S pole 42*b*) are disposed at locations which are not exposed at an outer circumferential surface of the rotor 42, that is, an inner portion of the rotor 42.

The synchronous motor 134 according to the present embodiment may include either the SPMSM illustrated in FIG. 3 or the IPMSM illustrated in FIG. 4.

In addition, the synchronous motor 134 may include a senseless motor in which a sensor (a hall element or the like) for detecting a phase angle of the rotor 42 is not installed.

Meanwhile, although the case in which the U-phase coil 43, the V-phase coil 44, and the W-phase coil 45 are concentrically wound around the stator 41 in the disclosed synchronous motor 134 is illustrated, the coils may also be dispersedly wound therearound. In addition, the synchronous motor 134 may also include four poles or more, and there is no limitation in the number of the poles.

Control System of Air Conditioning Device

Figure 5:
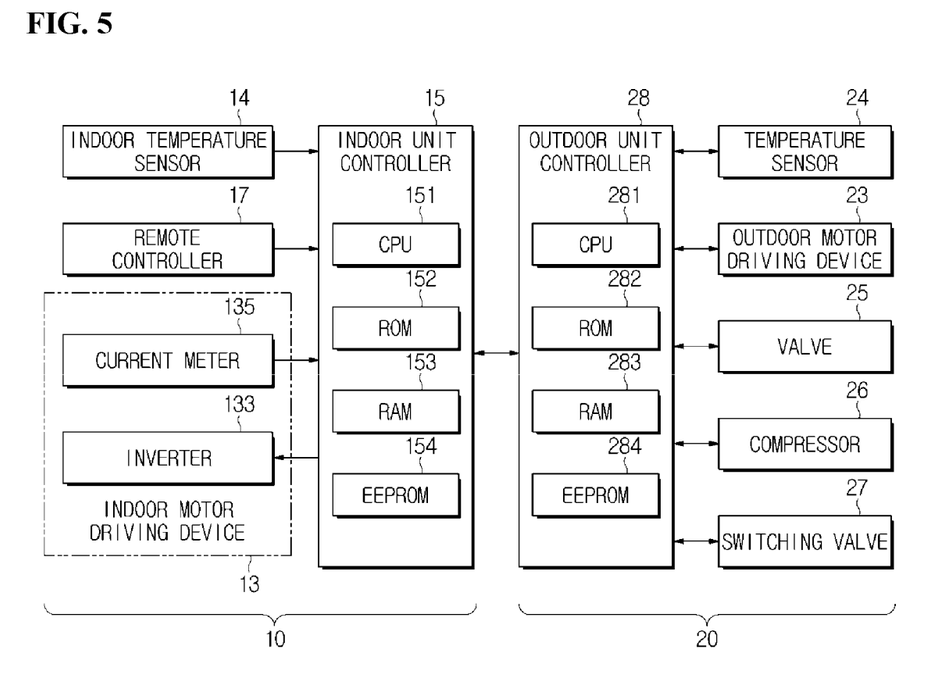
FIG. 5 is a control block diagram for describing a control system of the air conditioning device according to one embodiment.

FIG. 5 is a control block diagram for describing a control system of the air conditioning device according to one embodiment.

The disclosed control system may include the indoor unit controller 15 installed in the indoor unit 10 to control components and devices in the indoor unit 10, the outdoor unit controller 28 installed in the outdoor unit 20 to control units in the outdoor unit 20, and a communication path connecting the indoor unit controller 15 and the outdoor unit controller 28 so that a signal is transmitted or received between the indoor unit controller 15 and the outdoor unit controller 28.

First, the indoor unit controller 15 includes a central processing unit (CPU) 151 configured to read and execute programs, a read only memory (ROM) 152 configured to store the programs executed by the CPU 151, data used when the programs are executed, and the like, a random access memory (RAM) 153 configured to store data and the like temporarily generated when programs are executed, and an electrically erasable programmable ROM (EEPROM) 154 configured to store data and the like used when the programs are executed, and capable of rewriting the contents and storing the stored contents even when power is not supplied.

In addition, an indoor temperature signal is input to the indoor unit controller 15 from the indoor temperature sensor 14, and an instruction signal is input to the indoor unit controller 15 from the remote controller 17. In addition, measured U-phase, V-phase, and W-phase current signals are input to the indoor unit controller 15 from the current meter 135 installed in the indoor motor driving device 13. In addition, a control signal may be input to the indoor unit controller 15 from the outdoor unit controller 28.

Meanwhile, the indoor unit controller 15 outputs a control signal to the inverter 133 installed in the indoor motor driving device 13. In addition, the indoor unit controller 15 outputs a control signal to the outdoor unit controller 28.

The outdoor unit controller 28 includes a CPU 281 configured to read and execute programs, a ROM 282 configured to store the programs executed by the CPU 281, data used when the programs are executed, and the like, a RAM 283 configured to store data and the like temporarily generated when the programs are executed, and an EEPROM 284 configured to store data and the like used when the programs are executed, and capable of rewriting the contents and storing the stored contents even when power is not supplied.

An outdoor temperature signal is input to the outdoor unit controller 28 from the outdoor temperature sensor 24. In addition, a control signal may also be input to the outdoor unit controller 28 from the indoor unit controller 15.

Meanwhile, the outdoor unit controller 28 outputs a control signal to each of the expansion valve 25, the compressor 26, and the four-way switching valve 27. In addition, the outdoor unit controller 28 outputs a control signal to the indoor unit controller 15.

Figure 6:
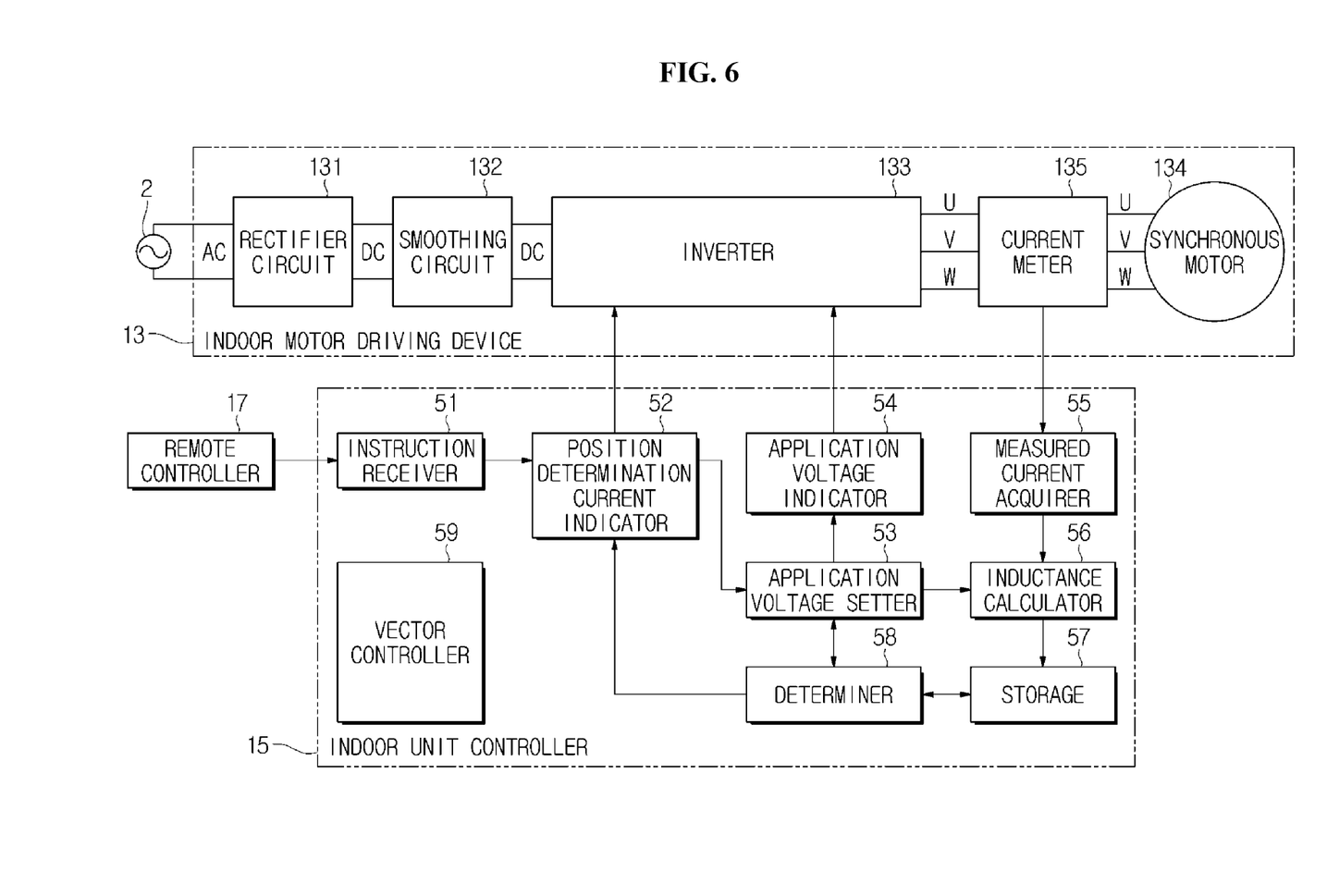
FIG. 6 is a control block diagram illustrating an indoor unit controller according to one embodiment.

FIG. 6 is a control block diagram illustrating an indoor unit controller according to one embodiment. Specifically, FIG. 6 is a software block diagram of the indoor unit controller 15 in the disclosed air conditioning device 1.

The indoor unit controller 15 controls operation of the synchronous motor 134 installed in the indoor motor driving device 13 through vector control. To perform vector control on the synchronous motor 134, the indoor unit controller 15 acquires various motor constants including an inductance of the synchronous motor 134 in advance. In addition, FIG. 6 shows a block related to acquirement of the inductance needed to perform the vector control on the synchronous motor 134, selected from among various controls performed by the indoor unit controller 15.

Specifically, the indoor unit controller 15 includes a instruction receiver 51, a position determination current indicator 52, an application voltage setter 53, an application voltage indicator 54, a measured current acquirer 55, an inductance calculator 56, a storage 57, a determiner 58, and a vector controller 59.

The instruction receiver 51 receives an instruction (of turning a power source on or the like) from the remote controller 17.

In a case in which the instruction receiver 51 has received an instruction of turning a power source on, when an inductance of the synchronous motor 134 is calculated, the position determination current indicator 52 sets a position determination current (one example of fixed current) for position determination (position fixing) of the rotor 42 (see FIG. 3 or 4) with respect to the stator 41. In addition, the position determination current indicator 52 informs the inverter 133 of the set position determination current.

As one example of a converter, the application voltage setter 53 sets a voltage (one example of an AC voltage) applied to the synchronous motor 134 to a state in which a position of the rotor 42 in the synchronous motor 134 is determined (fixed) with respect to the stator 41 (see FIG. 3 or 4) according to supply of the position determination current.

As one example of a voltage supply device, the application voltage indicator 54 informs the inverter 133 of the application voltage set by the application voltage setter 53.

The measured current acquirer 55 acquires a current (a measured current, one example of introduced current) measured by the current meter 135 and flowing from the inverter 133 to the synchronous motor 134.

As one example of an estimating device, the inductance calculator 56 calculates an inductance of the synchronous motor 134 using the application voltage set by the application voltage setter 53 and the measured current acquired by the measured current acquirer 55.

The storage 57 stores the inductance of the synchronous motor 134 calculated by the inductance calculator 56.

The determiner 58 determines whether the inductance calculated by the inductance calculator 56 and stored in the storage 57 is correct. In addition, in a case in which the determiner 58 determines that the inductance stored in the storage 57 is not correct, the determiner 58 outputs an instruction for changing an application voltage to the application voltage setter 53.

After the inductance of the synchronous motor 134 is determined, the vector controller 59 controls a vector of the synchronous motor 134 using motor constants of the synchronous motor 134 including the inductance.

In addition, the inductance calculator 56 and the determiner 58 are operated as setting devices.

Meanwhile, the software block diagram illustrated in FIG. 6 is only one example for specifically describing operation of the indoor unit controller 15. That is, the indoor unit controller 15 may be provided as a processor for controlling operation of the indoor motor driving device 13, provided as a single chip or a plurality of semiconductor elements, and is not limited thereto.

In addition, although the indoor unit used in an air conditioner according to one embodiment is specifically described with reference to FIG. 6, the indoor unit may also be used in a general motor driving device. In this case, the indoor motor driving device 13 may denote one of various synchronous motors, that is, a device configured to drive a motor, and the indoor unit controller 15 may denote a controller configured to control a motor driving device.

Operation of Air Conditioning Device

One example of operation of the disclosed air conditioning device 1, particularly a cooling operation, will be described.

When the indoor unit controller 15 installed in the indoor unit 10 receives an instruction signal for starting cooling output from the remote controller 17, the indoor unit controller 15 starts the indoor motor driving device 13.

The indoor motor driving device 13 rotates the indoor fan 12. In addition, the indoor unit controller 15 having the instruction signal outputs a start request signal to the outdoor unit controller 28 installed in the outdoor unit 20.

The outdoor unit controller 28 having the start request signal starts the outdoor fan driving device 23 and sets the expansion valve 25, the compressor 26, and the four-way switching valve 27 in a cooling state. Therefore, a refrigerant, which is not shown, is transferred and circulated between the indoor heat exchanger 11 of the indoor unit 10 and the outdoor heat exchanger 21 of the outdoor unit 20 through the pipe 30. As a result, cool air is introduced into an inside of a house (interior) by the indoor heat exchanger 11 and warm air is discharged to the outside of the house by the outdoor heat exchanger 21.

Here, since the indoor fan 12 is rotated by the indoor motor driving device 13 in the indoor unit 10, the cool air introduced by the indoor heat exchanger 11 is diffused to the interior.

Meanwhile, since the outdoor fan 22 is rotated by the outdoor fan driving device 23 in the outdoor unit 20, the warming air introduced by the outdoor heat exchanger 21 is diffused to the outside. In addition, the indoor unit controller 15 in the indoor unit 10 controls a rotational speed of the indoor motor driving device 13 on the basis of a set temperature set by the remote controller 17 and a result of an indoor temperature measurement performed by the indoor temperature sensor 14, and the outdoor unit controller 28 in the outdoor unit 20 controls the rotational speed of the indoor motor driving device 13 on the basis of a set temperature set by the remote controller 17 and a result of an outdoor temperature measurement performed by the outdoor temperature sensor 24, or controls a flow rate of the refrigerant (not shown) of the compressor 26.

Through the above-described process, an interior in which the indoor unit 10 is disposed is cooled to have the set temperature set by the remote controller 17. During the above-described process, the indoor unit controller 15, particularly the vector controller 59, installed in the indoor unit 10 performs vector control on the synchronous motor 134 using the inverter 133.

Staring Synchronous Motor

Figure 7:
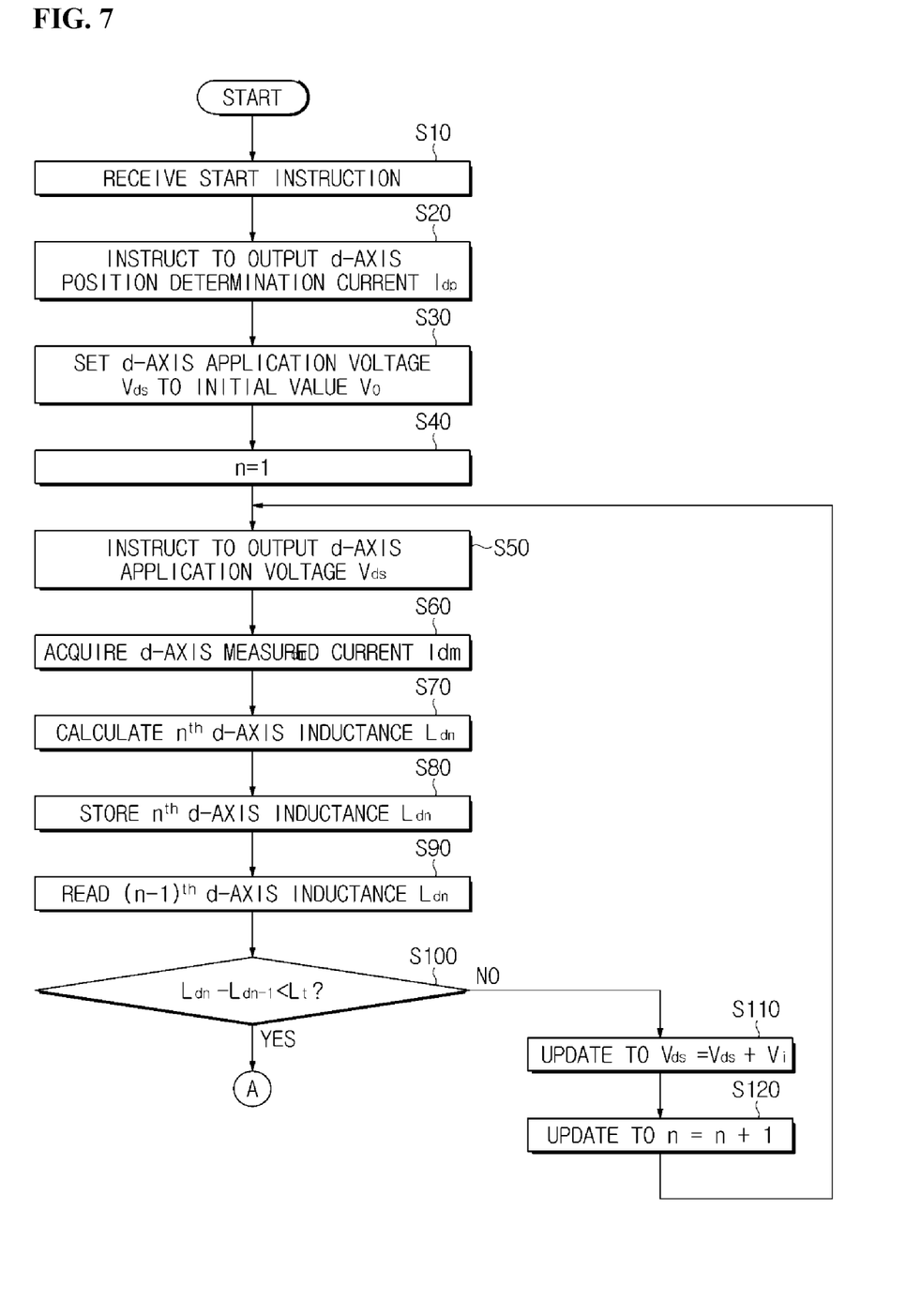
FIG. 7 is a flowchart for describing operations of the motor driving device according to one embodiment.
Figure 8:
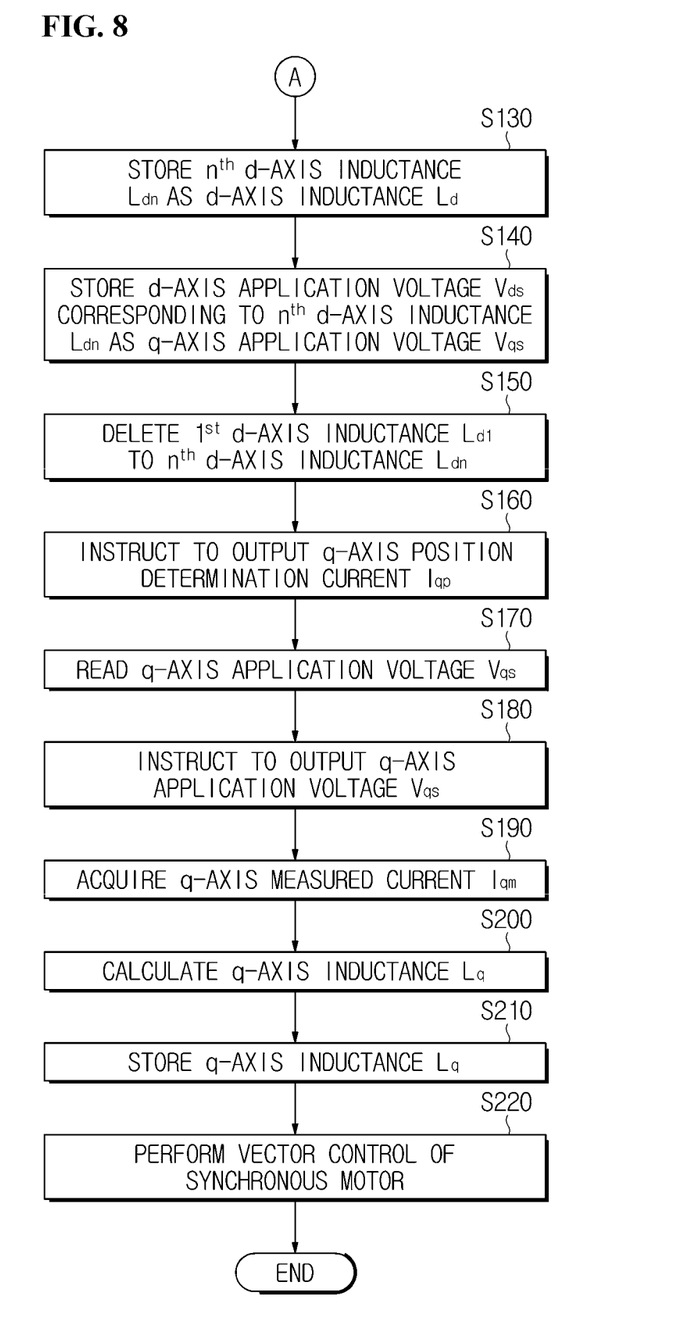
FIG. 8 is a flowchart continued from the flowchart of FIG. 7 for describing the operations of the motor driving device according to one embodiment.

FIG. 7 is a flowchart for describing operations of the motor driving device according to one embodiment. In addition, FIG. 8 is a flowchart continued from the flowchart of FIG. 7 for describing the operations of the motor driving device according to one embodiment. FIGS. 7 and 8 will be described together to avoid repeated descriptions.

The disclosed indoor unit controller 15 receives an instruction related to starting of the air conditioning device 1, specifically the indoor unit 10 and the outdoor unit 20, from the remote controller 17.

Next, the indoor unit controller 15 calculates an inductance of the synchronous motor 134 before performing vector control on the indoor motor driving device 13, particularly the synchronous motor 134.

Specifically, the indoor unit controller 15, particularly the instruction receiver 51, of the indoor unit 10 receives the instruction related to starting from the remote controller 17 (S10).

Next, the position determination current indicator 52 included in the indoor unit controller 15 instructs the inverter 133 of the indoor motor driving device 13 to output a d-axis position determination current $I_{dp}$ of the synchronous motor 134 for determining (fixing) a position of the rotor 42 to the d-axis (S20).

The indoor motor driving device 13 having the instruction supplies a U-phase d-axis position determination current, a V-phase d-axis position determination current, and a W-phase d-axis position determination current which correspond to the d-axis position determination current $I_{dp}$ of the synchronous motor 134. As a result, in the synchronous motor 134, the rotor 42 stops rotating after rotating a predetermined extent (for example, one turn or less) with respect to the stator 41. That is, a position of the d-axis of the rotor 42 with respect to the stator 41 is determined (fixed).

When the position of the d-axis of the rotor 42 is determined, the position determination current indicator 52 instructs to stop the output of the d-axis position determination current $I_{dp}$.

The application voltage setter 53 included in the indoor unit controller 15 sets a d-axis application voltage $V_{ds}$ to an initial value of V0 (S30), and sets a variable n to 1 (n=1, S40). In addition, the application voltage indicator 54 instructs the inverter 133 installed in the indoor motor driving device 13 to output an $n^{th}$ ($1^{st}$ at a first) d-axis application voltage $V_{ds}$ set by the application voltage setter 53 (S50).

Accordingly, in the indoor motor driving device 13, the inverter 133 supplies a U-phase d-axis application voltage, a V-phase d-axis application voltage, and a W-phase d-axis application voltage corresponding to an $n^{th}$ d-axis application voltage $V_{ds}$ to the synchronous motor 134. However, the rotor 42 of the synchronous motor 134 does not rotate with respect to the stator 41, and a state in which the position of the rotor 42 is determined (fixed) in operation S20 is maintained.

In addition, the measured current acquirer 55 included in the indoor unit controller 15 acquires a d-axis measured current $I_{dm}$ measured by the current meter 135 installed in the indoor motor driving device 13 and flowing from the inverter 133 to the synchronous motor 134 (S60).

In addition, the inductance calculator 56 included in the indoor unit controller 15 calculates an $n^{th}$ d-axis inductance $L_{dn}$ using the $n^{th}$ d-axis application voltage $V_{ds}$ output by the instruction in operation S50 and the $n^{th}$ d-axis measured current $I_{dm}$ acquired by operation 60 through Equation 1 (S70).

$$L_{dn}=(V_h-\Delta V-I_h\times R)/(\omega\times I_h) \qquad \text{Equation 1}$$

Here, $V_h$ is a peak value of the d-axis application voltage $V_{ds}$, $\Delta V$ is an error component of a voltage at a phase of an application voltage, $I_h$ is a peak value of the d-axis measured current $I_d$, R is an estimated impedance of a synchronous motor, and $\omega$ is an angular frequency of the d-axis application voltage $V_{ds}$.

Next, the inductance calculator 56 included in the indoor unit controller 15 stores the $n^{th}$ d-axis inductance $L_{dn}$ calculated in operation S70 in the storage 57 (RAM 153) included in the indoor unit controller 15 (S80).

Next, the determiner 58 included in the indoor unit controller 15 reads an $(n-1)^{th}$ d-axis inductance $L_{dn-1}$ stored before one $n^{th}$ d-axis inductance $L_{dn}$ from the storage 57 (S90).

Next, the determiner 58 determines whether a difference between the $n^{th}$ d-axis inductance $L_{dn}$ calculated in operation S70 and the $(n-1)^{th}$ d-axis inductance $L_{dn-1}$ read in operation S80 is less than a predetermined critical value $L_t$ ($L_{dn}-L_{dn-1}<L_t$, S100).

In a case in which a negative determination (NO) occurs in operation S100, the application voltage setter 53 included in the indoor unit controller 15 updates the d-axis application voltage $V_{ds}$ to a voltage in which an increase value $V_i$ is added to the application voltage $V_{ds}$ ($V_{ds}=V_{ds}+V_i$, S110).

In addition, the application voltage setter 53 updates the variable n to a number in which one is added to the current variable n (n=n+1, S120), and returns to and performs operation S50. Accordingly, operations S50 to S120 are repeated until a positive determination (YES) occurs in operation S100.

Meanwhile, in the case in which the positive determination (YES) occurs in operation S100, the determiner 58 included in the indoor unit controller 15 stores the $n^{th}$ d-axis inductance $L_{dn}$ calculated in operation S70 as a d-axis inductance $L_d$ of the synchronous motor 134 in the storage 57, for example, the EEPROM 154 (S130).

Next, the determiner 58 stores a $n^{th}$ d-axis application voltage $V_{ds}$ as a q-axis application voltage $V_{qs}$ in the RAM 153 or EEPROM 154. The $n^{th}$ d-axis application voltage Vds is stored as the d-axis inductance Ld in operation S130 corresponds to the nth d-axis inductance Ldn used in the calculation of the nth d-axis inductance Ldn in the storage 57.

Next, the determiner 58 erases from the $1^{st}$ d-axis inductance $L_{d1}$ to the $n^{th}$ d-axis inductance $L_{dn}$ stored in the storage 57 (S150). In this case, the application voltage indicator 54 instructs the inverter 133 installed in the indoor motor driving device 13 to stop the output of the d-axis application voltage $V_{ds}$.

The position determination current indicator 52 included in the indoor unit controller 15 instructs the inverter 133 included in the indoor motor driving device 13 to output q-axis position determination current $I_{qp}$ (S160).

Accordingly, in the indoor motor driving device 13, a U-phase q-axis position determination current, a V-phase q-axis position determination current, and a W-phase q-axis position determination current corresponding to the q-axis position determination current $I_{qp}$ start to be supplied to the synchronous motor 134. As a result, in the synchronous motor 134, the rotor 42 stops rotating after rotating a predetermined extent (for example, 90 degrees) with respect to the stator 41. That is, a position of the q-axis of the rotor 42 with respect to the stator 41 is determined (fixed).

When the position of the q-axis of the rotor 42 is determined, the position determination current indicator 52 instructs to stop the output of the q-axis position determination current $I_{qp}$.

Next, the application voltage setter 53 included in the indoor unit controller 15 reads the q-axis application voltage $V_{qs}$ which is stored in the storage 57 in operation S140 (S170).

In addition, the application voltage indicator 54 instructs the inverter 133 installed in the indoor motor driving device 13 to output the q-axis application voltage $V_{qs}$ set by the application voltage setter 53 (S180).

Accordingly, in the indoor motor driving device 13, a U-phase q-axis application voltage, a V-phase q-axis application voltage, and a W-phase q-axis application voltage corresponding to the q-axis application voltage $V_{qs}$ are supplied by the inverter 133 to the synchronous motor 134. However, the rotor 42 in the synchronous motor 134 does not rotate with respect to the stator 41, and a state in which the position of the rotor 42 is determined (fixed) in operation S160 is maintained.

In addition, the measured current acquirer 55 included in the indoor unit controller 15 acquires q-axis measured current $I_{qm}$ measured by the current meter 135 installed in the indoor motor driving device 13 and flowing from the inverter 133 to the synchronous motor 134 (S190).

In addition, the inductance calculator 56 included in the indoor unit controller 15 calculates a q-axis inductance $L_q$ using the q-axis application voltage $V_{qs}$ output by the instruction in operation S180 and the measured current $I_{qm}$ acquired in operation S190 through Equation 2 (S200).

$$L_q=(V_h-\Delta V-I_h\times R)/(\omega\times I_h) \qquad \text{Equation 2}$$

Here, $V_h$ is a peak value of the q-axis applied voltage $V_{qs}$, $\Delta V$ is an error component of a voltage at a phase of an application voltage, $I_h$ is a peak value of the q-axis measured current $I_{qm}$, R is an estimated impedance of the synchronous motor, and $\omega$ is an angular frequency of the q-axis application voltage $V_{qs}$.

In addition, Equation 2 is identical to Equation 1 except whether a target is the d-axis or q-axis.

The inductance calculator 56 included in the indoor unit controller 15 stores the q-axis inductance $L_q$ calculated in operation S200 in the storage 57, for example, the EEPROM 154, included in the indoor unit controller 15 (S210).

That is, the storage 57, for example, the EEPROM 154, stores both the d-axis inductance $L_d$ stored in operation S120 and the q-axis inductance $L_q$ stored in operation S210. In addition, the application voltage indicator 54 stops the outputting of the q-axis application voltage $V_{qs}$ to the inverter 133 installed in the indoor motor driving device 13.

Next, the vector controller 59 included in the indoor unit controller 15 performs vector control on the synchronous motor 134 (rotational control of the indoor fan 12 using the synchronous motor 134) using the inverter 133 installed in the indoor motor driving device 13 using motor constants of the synchronous motor 134 including the d-axis inductance $L_d$ and the q-axis inductance $L_q$ stored in the storage 57 (S220). That is, starting of the synchronous motor 134 including the calculating of the inductance of the synchronous motor 134 is completed.

Relation between Measured Current Value and Estimated Inductance Value

Figure 9:
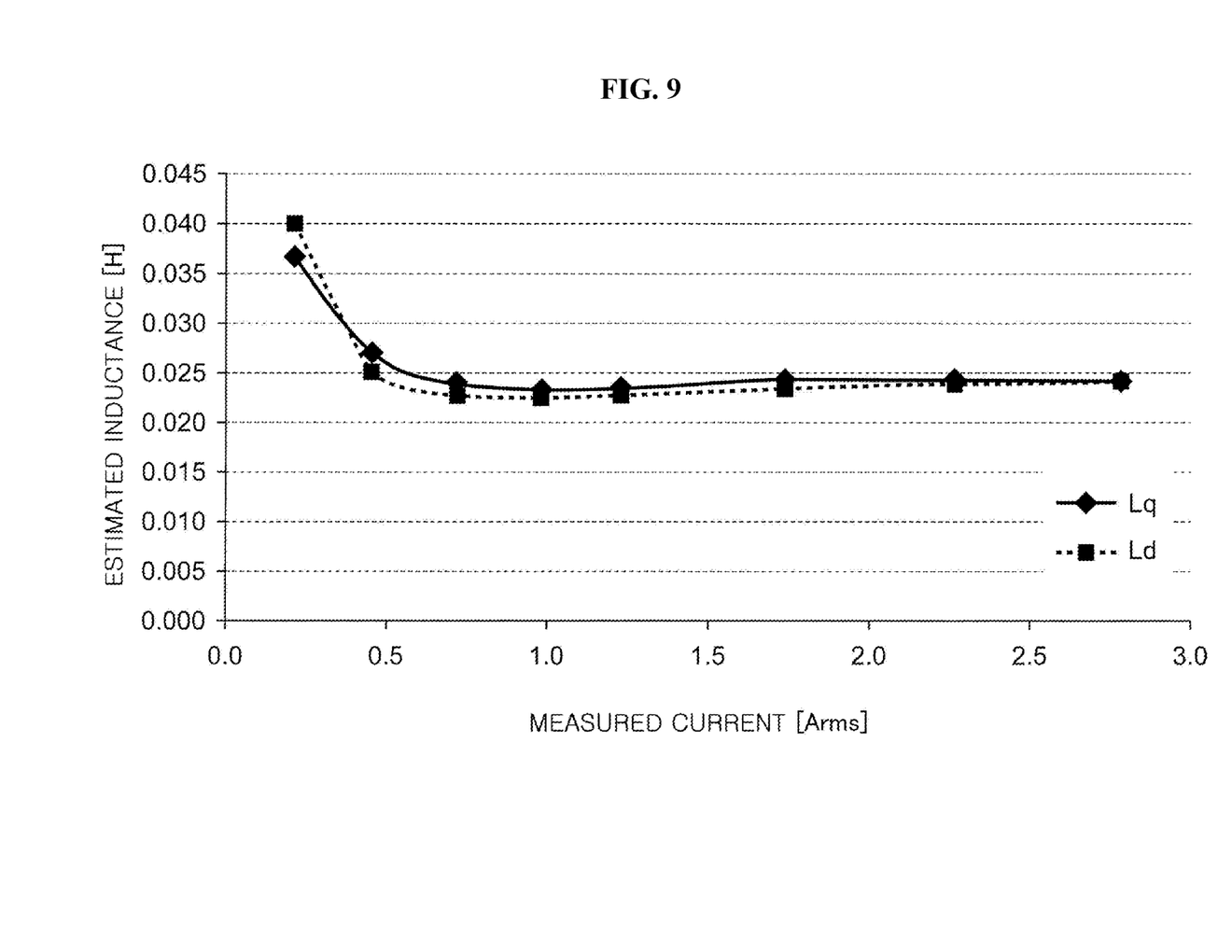
FIG. 9 is a graph showing a relation between a measured current and an inductance in the synchronous motor according to one embodiment.

FIG. 9 is a graph showing a relation between a measured current and an inductance in the synchronous motor according to one embodiment.

Specifically, FIG. 9 is a view illustrating a relation between the measured current value (the d-axis measured current $I_{dm}$ and the q-axis measured current $I_{qm}$) and the estimated inductance value (the d-axis inductance $L_d$ and the q-axis inductance $L_q$) in the synchronous motor 134.

Referring to FIG. 9, the d-axis inductance $L_d$ gradually decreases according to an increase in the d-axis measured current $I_{dm}$, that is, an increase in the d-axis application voltage $V_{ds}$, and when the d-axis measured current $I_{dm}$ is greater than a certain value (about 0.75 Arms to 1.0 Arms), the inductance $L_d$ is saturated at a constant level.

In addition, the q-axis inductance $L_q$ also decreases according to the increase in the q-axis measured current $I_{qm}$, that is, the increase in the q-axis application voltage $V_{qs}$, and when the q-axis measured current $I_{qm}$ is greater than a certain value (about 0.75 Arms to 1.0 Arms), the q-axis inductance $L_q$ is saturated at a constant level.

That is, in a case in which a measured current value (a d-axis measured current $I_{dm}$ and a q-axis measured current $I_{qm}$) is too low, an estimated inductance value (a d-axis inductance $L_d$ and a q-axis inductance $L_q$) becomes greater than an actual value. Comparatively, when a necessary and sufficient current flows to the synchronous motor 134 due to an increase in the measured current value, a magnetic saturation occurs in the synchronous motor 134, and the estimated inductance value becomes stably close to the actual value.

Meanwhile, when the current supplied to the synchronous motor 134 is increased after an effect of the magnetic saturation occurs, irreversible demagnetization of a magnetic pole (here, the N pole 42a and the S pole 42b) may occur in the synchronous motor 134. That is, when a current more than necessary is supplied to the synchronous motor 134, the synchronous motor 134 may fail.

To solve the above-described problem, when the disclosed motor driving device 13 starts the synchronous motor 134 having unknown motor constants, first, d-axis position determination current $I_{dp}$ is supplied to the synchronous motor 134 to fix the position of the rotor 42 with respect to the stator 41 on the d-axis. Next, an AC d-axis application voltage $V_{ds}$ is supplied to the synchronous motor 134, and the d-axis application voltage $V_{ds}$ supplied to the synchronous motor 134 is gradually increased.

In addition, an inductance of the synchronous motor 134 is calculated using the d-axis application voltage $V_{ds}$ and the d-axis measured current $I_{dm}$ flowing in the synchronous motor 134 supplied with the d-axis application voltage $V_{ds}$ through Equation 1, and an inductance value in a state in which a change of the inductance value is saturated according to a change in the d-axis measured current $I_{dm}$ is determined as the d-axis inductance $L_d$ of the synchronous motor 134.

Next, in the motor driving device 13 according to the present embodiment, in a case in which the q-axis inductance $L_q$ which is an inductance of the q-axis perpendicular to the d-axis, is calculated, the same method used when the above-described d-axis inductance $L_d$ is calculated is not used, but the position of the rotor 42 with respect to the stator 41 is fixed to the q-axis, the d-axis application voltage $V_{ds}$ used when the d-axis inductance $L_d$ is acquired is used as a q-axis application voltage $V_{qs}$, and the q-axis inductance $L_q$ is calculated without gradually increasing the application voltage $V_{qs}$.

In short, in the present disclosure, after the d-axis inductance $L_d$ is calculated according to the above-described sequence, the q-axis application voltage $V_{qs}$ (determined on the basis of the d-axis application voltage $V_{ds}$) is supplied to the synchronous motor 134, and an inductance calculated using the q-axis application voltage $V_{qs}$ and the q-axis measured current $I_{qm}$ flowing in the synchronous motor 134 supplied with the q-axis application voltage $V_{qs}$ through Equation 2 is determined as the q-axis inductance $L_q$ of the synchronous motor 134.

Through the above-described operations, the synchronous motor 134 having unclear properties is prevented from being supplied with an excessive current, failure of the synchronous motor 134 is suppressed, and the inductance (the d-axis inductance $L_d$ and the q-axis inductance $L_q$) of the synchronous motor 134 can be calculated.

In the related art, to estimate an inductance of the synchronous motor 134 more accurately, an dedicated controller (indoor unit controller 15) has to be prepared for each types of a synchronous motor 134 according to properties of the synchronous motor 134.

However, since the indoor unit controller 15 according to the disclosed embodiment may determine a threshold value of each of the d-axis application voltage $V_{ds}$ (the d-axis measured current $I_{dm}$) and the q-axis application voltage $V_{qs}$ (the q-axis measured current $I_{qm}$) according to properties (ratings) of the synchronous motor 134, the indoor unit controller 15 has versatility. That is, the disclosed indoor unit controller 15 can be used in a plurality of types of air conditioning device 1 having different capacities (cooling or warming capacities), and the indoor unit controller 15 can perform vector control on the synchronous motor 134 in the air conditioning devices.

Meanwhile, the example of the synchronous motor 134 having a permanent magnet has been described above, but the synchronous motor 134 is not limited thereto, and may also be applied to various motors.

In addition, the disclosed process of the calculating of the inductance is not necessary limited to the sequence in which the d-axis position determination current $I_{dp}$ is supplied to the synchronous motor 134 to fix the position of the rotor 42 with respect to the stator 41 to the d-axis, the d-axis application voltage $V_{ds}$ is applied to the synchronous motor 134 and the q-axis position determination current $I_{qp}$ is supplied to the synchronous motor 134 to fix the position of the rotor 42 with respect to the stator 41 to the q-axis, and the q-axis application voltage $V_{qs}$ is applied to the synchronous motor 134.

For example, in another disclosed process of calculating an inductance, in a case in which positions of the d-axis and the q-axis are known, a process in which a position of the rotor 42 with respect to the stator 41 is fixed may be omitted. That is, in the case in which the positions of the d-axis and the q-axis are known, the d-axis application voltage $V_{ds}$ or the q-axis application voltage $V_{qs}$ does not need to be applied after the d-axis position determination current $I_{dp}$ or the d-axis position determination current $I_{dp}$ is supplied.

The invention claimed is:

1. A motor driving device comprising:
a motor;
an inverter configured to supply an alternating current (AC) voltage to the motor;
a current meter configured to measure an introduced current flowing in the motor based on the AC voltage; and
at least one processor configured to control the inverter to gradually change a magnitude of the AC voltage and calculate an inductance of the motor based on the introduced current measured by the current meter.

2. The motor driving device of claim 1, wherein the at least one processor is configured to calculate a d-axis inductance or q-axis inductance of the motor based on the introduced current measured by the current meter.

3. The motor driving device of claim 2, wherein, when a change in the d-axis inductance calculated based on the changed AC voltage is saturated, the at least one processor is configured to determine a value of the saturated inductance as a d-axis inductance.

4. The motor driving device of claim 2, wherein the at least one processor is configured to calculate the d-axis inductance and rotate a rotor of the motor at a predetermined angle.

5. The motor driving device of claim 2, wherein the at least one processor is configured to calculate the d-axis inductance and calculate the q-axis inductance based on the AC voltage changed when the d-axis inductance is calculated.

6. The motor driving device of claim 5, wherein the at least one processor is configured to control the inverter to supply the changed AC voltage to the motor, and calculate the q-axis inductance based on the introduced current measured by the current meter.

7. The motor driving device of claim 1, wherein:
the motor includes a rotor including a permanent magnet and a stator; and
the at least one processor is configured to control the rotor to determine a position of the rotor and control the inverter to gradually change the AC voltage.

8. A method of controlling a motor driving device including a motor and an inverter configured to control the motor, the method comprising:
gradually changing a magnitude of an alternating current (AC) voltage;

suppling, by the inverter, the AC voltage to the motor;
measuring an introduced current flowing in the motor based on the changed AC voltage; and
calculating an inductance of the motor based on the measured introduced current.

9. The method of claim 8, wherein the calculating includes calculating a d-axis inductance or q-axis inductance of the motor based on the measured introduced current.

10. The method of claim 9, wherein, when a change in the d-axis inductance calculated based on the changed AC voltage is saturated, the calculating includes determining a value of the saturated inductance as a d-axis inductance.

11. The method of claim 9, wherein the calculating includes calculating the q-axis inductance based on the changed AC voltage when the d-axis inductance is calculated.

12. The method of claim 11, wherein the calculating includes:
storing a d-axis inductance calculated based on the AC voltage as a first result value;
storing a d-axis inductance calculated according to the gradually changed AC voltage as a second result value; and
comparing the first result value and the second result value and determining the d-axis inductance.

13. The method of claim 9, further comprising performing vector control on the motor based on the calculated d-axis inductance or the calculated q-axis inductance.

14. The method of claim 9, further comprising suppling, by the inverter, a position determination current to the motor and fixing a position of the motor.

15. An air conditioning device comprising:
a heat exchanger configured to exchange heat of air using a refrigerant;
a fan configured to be rotatable and introduce the air into the heat exchanger; and
a motor driving device configured to drive the fan,
wherein the motor driving device includes
a motor configured to rotate the fan,
an inverter configured to supply an alternating current (AC) voltage to the motor,
a current meter configured to measure an introduced current flowing in the motor based on the AC voltage, and
at least one processor configured to perform vector control on the inverter, control the inverter to gradually change a magnitude of the AC voltage, and calculate an inductance of the motor based on the introduced current.

16. The air conditioning device of claim 15, wherein the at least one processor is configured to calculate a d-axis inductance or q-axis inductance of the motor based on the introduced current measured by the current meter.

* * * * *